United States Patent [19]
Witte

[11] Patent Number: 5,736,882
[45] Date of Patent: Apr. 7, 1998

[54] COMPLEMENTARY CLOCK SYSTEMS

[75] Inventor: Franz-Otto Witte, Emmendingen, Germany

[73] Assignee: Deutsche ITT Industries, GmbH, Freiburg, Germany

[21] Appl. No.: 762,133

[22] Filed: Dec. 9, 1996

[30] Foreign Application Priority Data

Dec. 23, 1995 [DE] Germany ............ 195 48 629.3

[51] Int. Cl.$^6$ .................................................. H03K 5/13
[52] U.S. Cl. .......................... 327/259; 327/171; 327/256; 327/257; 327/295
[58] Field of Search .................................. 327/171, 182, 327/256, 257, 259, 295, 291, 292, 172, 174

[56] References Cited

U.S. PATENT DOCUMENTS

| | | | |
|---|---|---|---|
| 3,961,269 | 6/1976 | Alvarez, Jr. ................... | 328/62 |
| 4,645,946 | 2/1987 | Ishikawa et al. ............... | 307/261 |
| 5,041,738 | 8/1991 | Walter, Jr. ...................... | 307/269 |
| 5,047,659 | 9/1991 | Ullrich ........................... | 307/269 |

FOREIGN PATENT DOCUMENTS 2448117  4/1974  Germany.

Primary Examiner—Timothy P. Callahan
Assistant Examiner—An T. Luu
Attorney, Agent, or Firm—Plevy & Associates

[57] ABSTRACT

A complementary clock system is disclosed for producing antiphase clock signals. The system includes a clock generator for producing a first clock signal (t3) and a second clock signal (t4). A first and second driver stage coupled to the clock generator for driving respective clock lines having a capacitive load that corresponds to a first load capacitance and a second load capacitance, respectively. A switchable current path coupled between the first and second clock lines which contains a gating circuit and at least one inductive element. The gating circuit being in a conducting state essentially during the switching intervals (ti) of the first and second clock signals (t3, t4).

19 Claims, 2 Drawing Sheets

COMPLEMENTARY CLOCK SYSTEMS

BACKGROUND OF THE INVENTION

1. Field of the Invention

The present invention relates generally to clock systems, and more particularly to a complementary clock system for producing antiphase clock signals utilized in clocked logic systems with monolithic integrated circuits, particularly CMOS circuits.

2. Description of the Prior Art

Complementary clock systems often utilize very high load currents which flow in the supply lines. These high load currents are caused essentially by the constant charging and discharging of the gate capacitances and increase in proportion to the clock frequency. The load currents, besides resulting in a high chip temperature due to dissipation, cause spurious radiation. The use of capacitive buffering of the current spikes at the external circuit terminals is unsatisfactory because the path via the pins is already too long. Further, these difficulties increase with higher clock frequencies.

It is therefore, an object of the present invention to provide a complementary clock system for antiphase clock signals wherein both the peak values and the time average value of the load currents flowing in the supply lines are reduced without reducing the signal-processing speed.

SUMMARY OF THE INVENTION

A clock circuit is disclosed which is of the type typically including a clock generator for producing complementary clock signals (t3,t4), clock lines having associated load capacitances and driver stages for driving the load capacitances according to the clock signals (t3,t4). According to the present invention, the improvement includes a means for providing a switchable current path between the clock lines in order to provide a compensating current for partially charging and discharging the load capacitances during a transition period (ti) of the clock signals (t3,t4).

The switchable current path means as disclosed includes a gating circuit and at least a first inductive element, wherein the inductive element along with the load capacitances form a resonant circuit which supplies the compensating current when the gating circuit is in a "conducting" state. The gating circuit is switched to the "conducting" state by a gating signal which is a pulse produced by the clock generator.

BRIEF DESCRIPTION OF THE DRAWING

The above objects, further features and advantages of the present invention are described in detail below in conjunction with the drawings, of which.

DETAILED DESCRIPTION OF THE DRAWING

Figure 1:
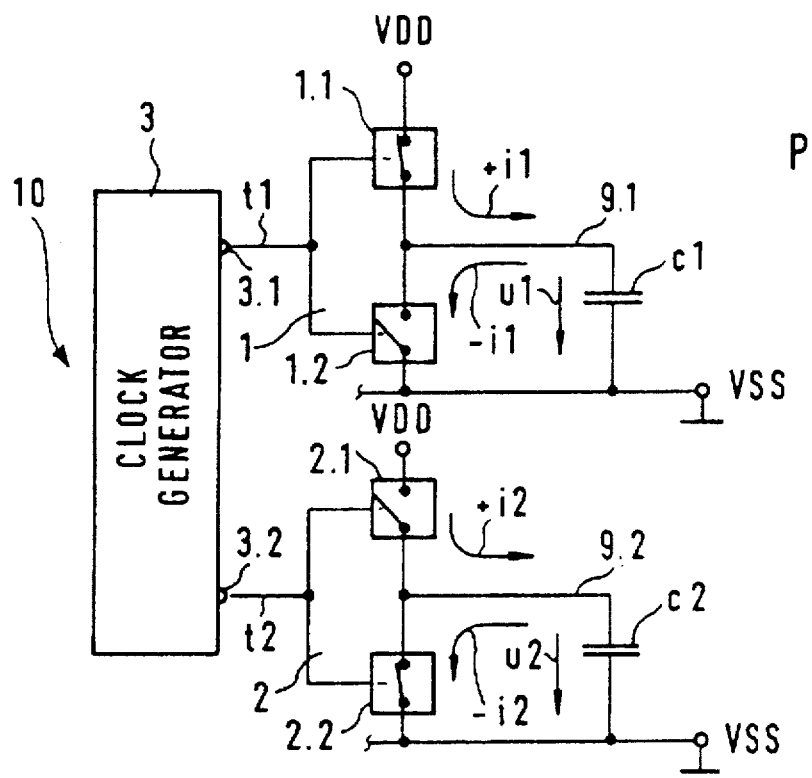
FIG. 1 is a schematic diagram of a prior art clock system.

The present invention is directed to a complementary clock system for providing antiphase clock signals. The clock system includes a clock generator for producing a first clock signal and a second clock signal. A first driver stage and a second driver stage is connected to a first clock line and a second clock line, respectively. The capacitive loads on the first and second clock lines correspond to a first load capacitance and a second load capacitance, respectively. A switchable current path is provided between the first and second clock lines having an "ON" time which is controlled by means of a gating circuit contained in the switchable current path. The gating circuit further containing at least one inductive element and remains in a conducting state essentially during the switching intervals of the first and second clock signals.

The present invention is predicated on the fact that in conventional driver stages the charging current for one of the load capacitances is supplied from the positive supply source and the discharging current is discharged to the negative supply source or to ground. Nearly simultaneously, the discharging and charging currents for the other load capacitance flow in the respective opposite directions.

Through the present invention, a portion of these currents can be used to initially charge or discharge the respective other load capacitance during the switching interval. This is achieved by means of a switchable current path between the two clock lines which is switched into the conducting state in the appropriate time interval, i.e., at the beginning of the charging or discharging process. However, this would require a very short and temporally precisely positioned gating pulse. A considerable improvement in the behavior is achieved by an inductive design of the switched current path, because energy is thus stored and current flow will be maintained even if the potentials in the two load capacitances are equal or if a reverse voltage is already present. Since these processes take place in the dynamic range, their application is only interesting for high clock frequencies, but there all the more so.

The circuit arrangement according to the present invention will advantageously be chosen so that the inductance of the switched current path and the load capacitances form a resonant circuit whose resonant frequency is such that a half cycle is approximately equal to the duration of the clock pulse transitions. Thus, the switched current path is switched into the conducting state for respective half cycles, so that part of the load stored in one of the load capacitances can flow into the other load capacitance, the resonant circuit loop being opened in the respective nonconducting states if possible. The remainder of the charging or discharging then takes place via the usual driver stages.

During the ON time of the switched current path, the driver stages should be separated or decoupled from the supply sources, so that the resonant circuit will not be short-circuited. For the sake of clarity, however, appropriate interrupting or decoupling circuits are not shown in the embodiment. Such circuits are not necessary if the leads to the driver stages act as chokes in this frequency range.

Another advantage of the present invention is that the necessary gating time is related to the clock frequency permitted for the respective technology, because the duration of the clock pulse transitions is also dependent on the respective technology.

Referring to FIG. 1, there is shown a schematic diagram of a prior art clock system. The system 10 includes a clock generator 3 that provides antiphase and non-overlapping clock signals t1 and t2 via a first output 3.1 and a second output 3.2 to a first driver stage 1 and a second driver stage 2, respectively. Each of the driver stages contains a pair of push-pull circuits 1.1, 1.2 and 2.1, 2.2, which are powered with a positive supply voltage VDD and a negative supply voltage VSS.

Connected to the output of each of the driver stages 1,2 is a respective clock line 9.1,9.2 which provides the connection to a first load capacitance c1 and a second load capacitance c2, respectively. Charging or discharging of the load capacitances c1,c2 is effected by a first load current i1 and a second load current i2, respectively. The positive current direction being defined by the direction in which charging takes place.

Figure 2:
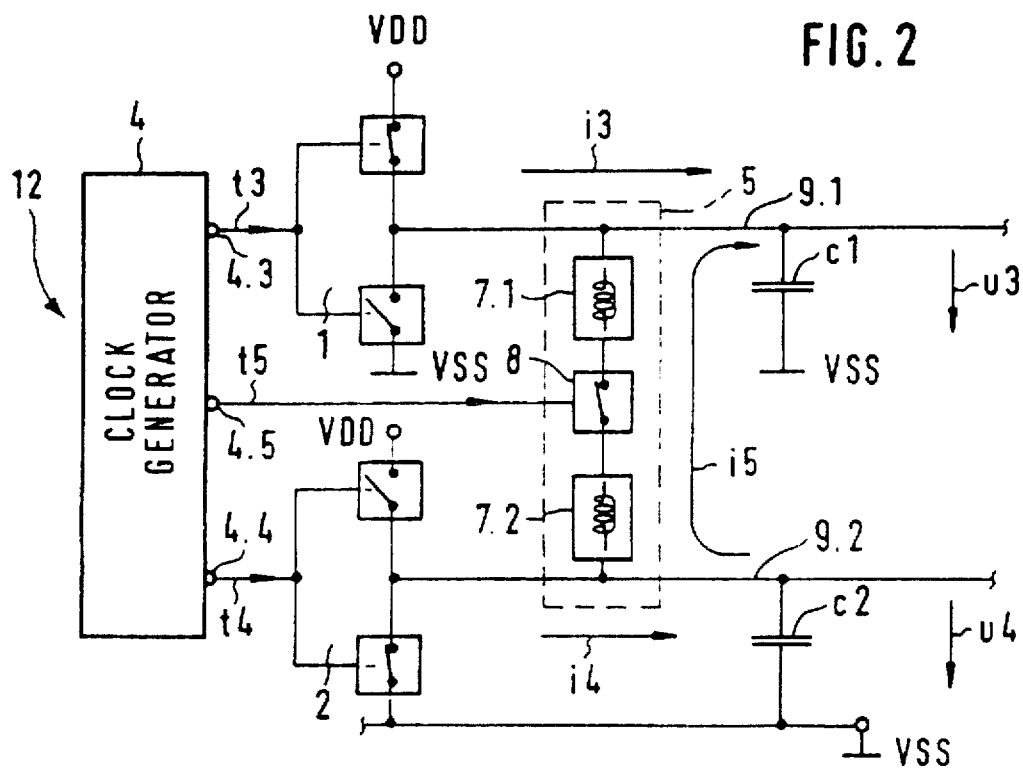
FIG. 2 is a schematic diagram of a clock system according to the present invention.

Referring to FIG. 2, a schematic diagram of a clock system according to the present invention is shown. The circuit of FIG. 2 contains a number of similar elements as the circuit of FIG. 1, wherein like reference characters have been used to designate such elements, which will not be explained again. The circuit 12 includes a clock generator 4 that in addition to the outputs 4.3,4.4 for the first and second clock signals t3 and t4, includes an output 4.5 for a gating signal t5.

The circuit 12 further includes a switchable current path 5 between the first and second clock lines 9.1,9.2. The current path 5 contains a series combination of a first inductive element 7.1, a gating circuit 8, and a second inductive element 7.2. The control input of the gating circuit 8 is connected to the gating-signal output 4.5 of the clock generator 4. The two inductive elements 7.1, 7.2 together form an inductance L, which has only been divided for better symmetry of the circuit. The currents i3 and i4, which are delivered by the driver stages 1 and 2, respectively, are indicated as arrows and define the positive current direction.

The current through the switched current path 5 is shown for the positive direction as an arrow i5. From FIG. 2 it is readily apparent that the series combination of the two load capacitances c1, c2, henceforth called "capacitance C", and the inductance L form a resonant circuit which is completed via the gating circuit 8 and the common ground connection VSS. The known formula for the resonant frequency (fr) is:

$$fr = 1/[2\pi \cdot SQR(L \cdot C)] \qquad (1)$$

The value of the load capacitances c1, c2, besides depending on the technology used, is also directly dependent on the respective circuit size. In the case of large circuits, it is quite possible that the value lies between 40 pF and 80 pF. A rough calculation shows that for a pulse transition time of 2 ns to 6 ns, which approximately corresponds to a clock frequency of a few 100 MHz, an inductance of 1 to 2 nH is required. This corresponds to a bond-wire connection with an overall length of approximately 1 mm to 2 mm.

The above described orders of magnitude are readily implemented in a monolithic integrated circuit. For example, this bonding can be carried out as single or multiple bonding on separate bond contacts on the chip. Of course, such small inductances can also be implemented via flat-coil arrangements consisting of one or more layers of metallization or in another manner.

Figure 3:
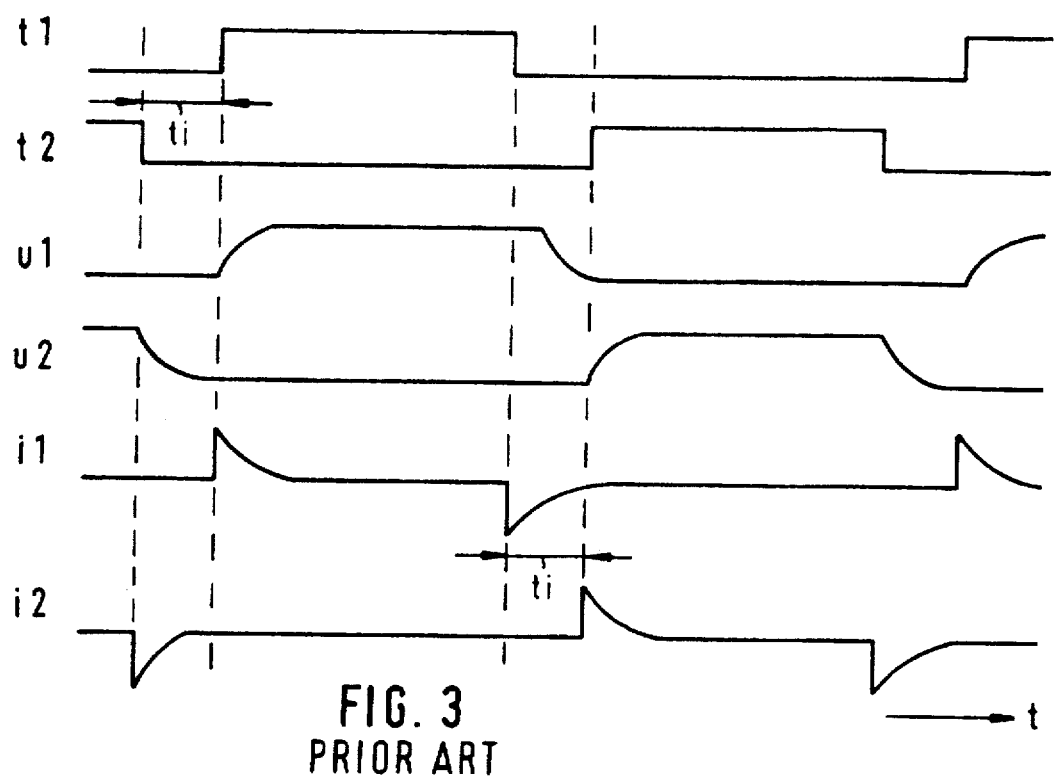
FIG. 3 is a diagram of the signals produced by the prior art clock system.

Referring to FIG. 3, there is shown a timing diagram of the essential signals of the known clock system of FIG. 1. The voltages u1 and u2 across the first and second load capacitances c1 and c2 result from the two non-overlapping and antiphase clock signals t1 and t2, respectively. The associated charging and discharging currents i1 and i2 show which load capacitance is being charged or discharged. The non-overlapping range is determined essentially by the switching interval ti of the first and second clock signals t1,t2.

Figure 4:
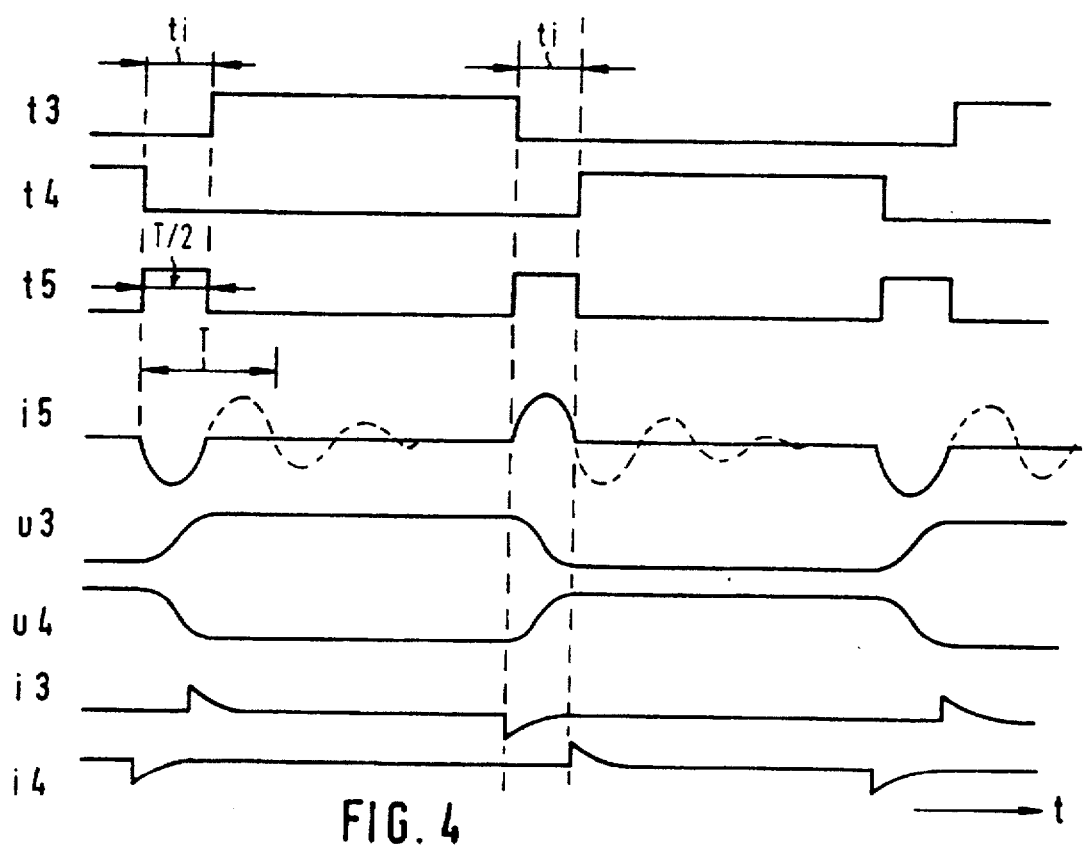
FIG. 4 is a diagram of the signals produced by the clock system according to the present invention.

Referring to FIG. 4, a timing diagram of the essential signals of the clock system of FIG. 2 is shown. In FIG. 4, the two clock signals t3,t4 are also of opposite phase and non-overlapping, wherein both signals are simultaneously at a zero potential in the switching interval ti. The operation of the switched current path 5 requires that a voltage difference exists between the first and second clock lines 9.1,9.2 since otherwise no compensating current would flow.

In the ON state, the gating signal t5, which is approximately identical in time with the switching interval ti, causes the current path 5 to conduct, thereby enabling the compensating current i5 to flow. Because of the attenuating elements in the resonant circuit, the excited oscillation would die out, which is indicated in graph i5 by the dashed wave portions. If the gating circuit 8 is reopened after a half cycle T/2, the compensating current remains at the zero value until a new gating pulse closes the resonant circuit again. The gating pulse in the gating signal t5 occurs at twice the pulse repetition frequency of the two clock signals t3,t4.

The resultant waveforms of the voltages u3,u4 across the two load capacitances c1,c2 show that the crossover point is located at about half of the edge voltage. This is still sufficient for reliable operation in the high-speed range. The current pulses i3,i4 which are delivered by the driver stages 1,2 are significantly smaller than the corresponding current pulses i1,i2 of FIG. 3. This is due to part of the charging or discharging being effected by the compensating current i5.

The compensating current i5 generates only a very weak interference field because the radiating area is limited to the monolithic integrated circuit and is therefore is very small. The current pulses i3,i4 which must flow over the supply lines are reduced, so that the spurious radiation is decreased as desired. The development of heat in the circuit 12 has also been reduced because the compensating current i5 only needs to overcome the difference voltage between the two clock lines 9.1,9.2. During the level transitions, the two voltages u3,u4 first adapt to one another before assuming their new antiphase position. The remaining dissipation is thus greatly reduced.

While the invention has been particularly shown and described with reference to preferred embodiments thereof, it will be understood by those skilled in the art that changes in form and details may be made therein without departing from the spirit and scope of the present invention.

What is claimed is:

1. A clock circuit of the type typically including a clock generator for producing complementary clock signals (t3, t4), clock lines having associated load capacitances and driver stages for driving said load capacitances according to said clock signals (t3,t4), wherein the improvement therewith comprising:

means for providing a switchable current path between said clock lines in order to provide a compensating current for partially charging and discharging said load capacitances during a transition period (ti) of said clock signals (t3,t4).

2. The circuit of claim 1, wherein said driver stages are each push-pull circuits.

3. The circuit of claim 1, wherein said switchable current path means includes a gating circuit and at least a first inductive element, wherein said inductive element along with the said load capacitances form a resonant circuit which supplies said compensating current when said gating circuit is in a "conducting" state.

4. The circuit of claim 3, wherein said gating circuit is switched to said "conducting state" by a gating signal (t5) produced by said clock generator.

5. The circuit of claim 3, wherein said gating circuit is kept in said "conducting state" for a period of time equal to said transition period (ti) of said clock signals (t3,t4).

6. The circuit of claim 3, wherein said inductive element and said load capacitances have predetermined values that provide said resonant circuit with a half cycle (T/2) which is approximately equal to said transition period (ti) of said clock signals (t3,t4) and enables the gating circuit to be switched back to a "non-conducting" state every other half cycle (T/2).

7. The circuit of claim 3, wherein said switchable current path means includes a second inductive element.

8. The circuit of claim 7, wherein said inductive elements are implemented with at least one bond wire connection.

9. The circuit of claim 7, wherein said inductive elements are formed in a region of a semiconductor surface by means of a semiconductor fabrication process.

10. The circuit of claim 7, wherein said inductive elements are designed in the form of a coil fabricated in a region selected from the group consisting of a semiconductor region and a metallization region.

11. A clock circuit, comprising:
   a clock generator for producing complementary clock signals (t3,t4);
   clock lines having associated load capacitances;
   driver stages coupled between said clock generator and said clock lines for driving said load capacitances according to said clock signals (t3,t4); and
   means for providing a switchable current path between said clock lines in order to provide a compensating current during a transition period (ti) of said clock signals (t3,t4).

12. The circuit of claim 11, wherein said driver stages are each push-pull circuits.

13. The circuit of claim 11, wherein said switchable current path means includes a gating circuit and at least a first inductive element, wherein said inductive element along with the said load capacitances form a resonant circuit which supplies said compensating current when said gating circuit is in a "conducting" state.

14. The circuit of claim 13, wherein said gating circuit is switched to said "conducting state" by a gating signal (t5) produced by said clock generator.

15. The circuit of claim 13, wherein said gating circuit is kept in said "conducting state" for a period of time equal to said transition period (ti) of said clock signals (t3,t4).

16. The circuit of claim 13, wherein said inductive element and said load capacitances have predetermined values that provide said resonant circuit with a half cycle (T/2) which is approximately equal to said transition period (ti) of said clock signals (t3,t4) and enables the gating circuit to be switched back to a "non-conducting" state every other half cycle (T/2).

17. The circuit of claim 13, wherein said switchable current path means includes a second inductive element.

18. The circuit of claim 17, wherein said inductive elements are implemented with at least one bond wire connection.

19. The circuit of claim 17, wherein said inductive elements are formed in a region of a semiconductor surface by means of a semiconductor fabrication process.

* * * * *